United States Patent [19]

Hosten

[11] Patent Number: 4,761,213
[45] Date of Patent: Aug. 2, 1988

[54] TREATMENT FACILITY PARTICULARLY FOR PRINTED CIRCUIT BOARDS TO BE TREATED WHILE IN A HORIZONTAL PLANE

[75] Inventor: Daniel Hosten, Handzame, Belgium

[73] Assignee: Siemens Aktiengesellschaft, Berlin and Munich, Fed. Rep. of Germany

[21] Appl. No.: 53,707

[22] Filed: May 26, 1987

[30] Foreign Application Priority Data

Jul. 28, 1986 [DE] Fed. Rep. of Germany ....... 3625423

[51] Int. Cl.$^4$ ............................................. C25D 17/00
[52] U.S. Cl. .................................... 204/198; 204/275
[58] Field of Search ............... 204/198, 202, 206, 237, 204/275

[56] References Cited

U.S. PATENT DOCUMENTS 2,418,934  4/1947  Hirsch .................................. 51/163

Primary Examiner—T. M. Tufariello
Attorney, Agent, or Firm—Hill, Van Santen, steadman & Simpson

[57] ABSTRACT

A treatment facility, which has a continuous circulation of a treatment fluid between a supply reservoir and a treatment cell, characterized by an arrangement to prevent frothing and/or foaming of the treatment fluid being returned to the reservoir. The arrangement includes a distributor having an exit slot which is positioned in the reservoir with the exit slot being above the level of the fluid in the reservoir.

19 Claims, 1 Drawing Sheet

TREATMENT FACILITY PARTICULARLY FOR PRINTED CIRCUIT BOARDS TO BE TREATED WHILE IN A HORIZONTAL PLANE

BACKGROUND OF THE INVENTION

The present invention is directed to a treatment facility, particularly for printed circuit boards to be treated in a horizontal passage through the facility. The treatment facility includes a treatment cell to which a treatment fluid can be supplied from a supply reservoir by means of a pump, and has a drain line for discharging the supply treatment fluids emerging from the treatment cell back to the supply reservoir.

Treatment facilities, which have a continuous circulation of the treatment fluid, are particularly utilized in electroplating technology for pre-treatment, metallization and after-treatment of the workpieces. Utilization in currentless metallizations of a workpiece is likewise possible. Dependent on the nature of the treatment fluid utilized, air can be worked into the treatment fluid during the out-flow from the treatment facility into the supply reservoir and foam can be formed in the supply reservoir. Particularly given treatment fluids having a high wetting agent content, such as, for example, in a cleaner/conditioner solution employed for preparation of currentless metal deposition or given electrolyte solutions for the electro-deposition of tin, such a pronounced formation of foam can occur that great quantities of foam will emerge from the supply reservoir into the treatment facility.

When printed circuit boards are to be treated by a horizontal passage through a machine or treatment cell, an intense flooding of the through contact holes of the printed circuit board on the basis of particularly intensive circulation of the respective treatment fluid is achieved. However, the undesirable foaming will be promoted with increased circulation.

Anti-frothing agents are substances added to the foaming fluids in order to reduce or prevent foam formation. The anti-frothing agents are either surface-active substances which displace the frothing agent from the interface surface without themselves being frothing agents or, on the other hand, are products which increase the surface tension of the fluid. However, given the described treatments facility, the addition of such anti-frothing agents would have a considerable negative effect on the properties of the respective treatment solutions. Thus, chemical agents are excluded as a means for combatting the formation of foam.

SUMMARY OF THE INVENTION

The object of the present invention is to reduce or prevent the foam formation in the supply reservoir of a treatment facility which has a continuous circulation of the treatment fluid between a supply reservoir and a treatment cell.

This object is inventively achieved by an improvement in a treatment facility having a treatment cell for the treatment fluid, means for supplying fluid to the cell from a reservoir including a pump and means for discharging fluid from the cell to the reservoir including an out-flow or discharge conduit. The improvements are means for preventing or suppressing foaming of the fluid being returned to the reservoir including a distribution pipe having at least one exit slot, said distribution pipe being connected to the discharge line or out-flow conduit and being positioned in the reservoir with each exit slot being arranged above the fluid or liquid level in the reservoir.

The invention is based on the perception that a distributor pipe having an exit slot lying just above the liquid or fluid level in the supply reservoir will promote the escape of air or gasses. On the other hand, the exit cross section is increased by the exit slot so that a correspondingly reduced exit speed will occur and reduce the frothing of the fluid.

In accordance with the preferred development of the invention, it is provided that the discharge or out-flowing conduit discharges into the distributor pipe from below by a U-shaped elbow. A frothing can be decelerated to an even greater extent by use of the out-flow conduit fashioned as a siphon.

It has also been proved beneficial when the distributor pipe has the shape of a closed ring. The exit cross section can, therefore, be further increased. It is likewise expedient, then, for increasing the exit cross section that the distributor pipe is equipped with a continuous exit slot. It is also specifically beneficial in view of the degassing function of the exit slot when the distributor pipe comprises a round or oval cross section.

In accordance with further and, particularly, preferred embodiments of the invention, a regulating valve is arranged in the out-flow or discharge conduit. Such a regulating valve can then be set so that a fluid column extending up to the drain of the cell can be built up in the out-flow or discharge conduit. Based on the principal of the water jet pump, such a high liquid column then, already reliably prevents air from being worked into the container discharge.

Finally, it is also proven expedient when the regulating valve is arranged in the feed conduit between the pump and the supply reservoir. This regulating valve enables an especially simple and precise setting of the liquid or fluid level which, of course, should lie just below the exit slot.

Other advantages and features of the invention will be readily apparent from the following description, drawings and claims.

DESCRIPTION OF THE PREFERRED EMBODIMENT

Figure 1:
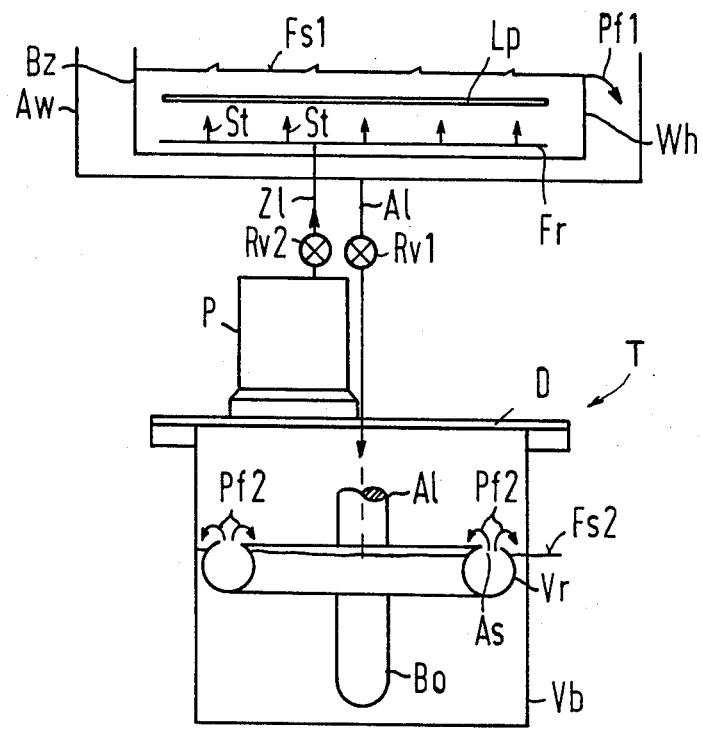
FIG. 1 is a schematic illustration with portions broken away for purpose of illustration of a treatment facility having the improvements of the present invention.

The principals of the present invention are particularly useful when incorporated in a treatment facility generally indicated at T in FIG. 1, which includes a treatment cell Bz. The treatment facility T is particularly useful for treating printed circuit boards Lp, which are conducted through the treatment cell Bz while being maintained in a horizontal plane with the assistance of conveyor rollers, which are not shown. The feed of the treatment fluid which is contained in a reservoir Vb occurs with the assistance of a supply means having a pump P, whose suction part or inlet is positioned in the fluid contained in the supply reservoir Vb. The pump P pumps the treatment fluid from the supply reservoir through a feed conduit Zl and into a flood register Fr which is arranged in the bottom of the treatment cell Bz under the path of the printed circuit boards Lp. As illustrated, the feed conduit Zl has a regulating valve Rv2. The flood register Fr is shown merely schematically and generates an upwardly directed flow indicated by arrows St and, thus, guarantees a uniform flooding or contacting of all the through contact holes of the printed circuit board Lp. The treatment cell Bz has a weir Wh for maintaining the liquid or fluid level Fs1 in the cell Bz. The treatment fluid, after being released in the direction of the arrows St from the flood register Fr, will then pass over the top edge of the weir Wh and into a collecting tank or holding chamber Aw.

The treatment fluid emerging from the cell Bz and collected in the collecting tank Aw is then returned to the supply reservoir Vb by means of discharge means, which include an out-flow or discharge conduit Al which extends through a cover D of the reservoir Vb. Thus, the system has a closed circulation in which a continuous circulation of the treatment fluid can occur.

Figure 2:
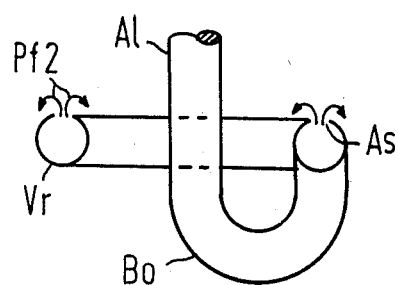
FIG. 2 is a side view of the distribution pipe of the treatment facility of FIG. 1.

After being conducted through the cover D of the supply reservoir Vb, the conduit Al will enter from below into an annular distributor pipe or tube Vr, preferably with a U-shaped elbow Bo, as illustrated in FIG. 2. The distributor pipe Vr is horizontally arranged in the supply reservoir Vb and has an annular proceeding exit slot As on its upper surface. As illustrated, the reservoir has the liquid or fluid level Fs2 and the distributor pipe Vr is positioned so that the slot As lies just above the fluid level Fs2 of the treatment fluid in the supply reservoir Vb. The corresponding setting of the liquid level Fs2 can, for example, be undertaken by a regulating valve Rv2.

The treatment fluid returns to the supply reservoir Vb, then emerges from the exit slot As just above the fluid level Fs2, as indicated by the arrows Pf2. The shape and position of the exit slot As thereby promotes an escape of any entrained gases or air. Moreover, the exit slot As increases the exit cross section so that a corresponding reduced exit speed of the treatment fluid can no longer produce a noticeable frothing of the fluid.

A control valve Rv1 is arranged in the discharge conduit Al and can be set so that the conduit Al is filled up to the discharge of the tank Aw. This results in allowing entrained gasses to be removed from the liquid or fluid in the tank Aw prior to the fluid flowing into the conduit Al and also prevents the introduction of air based on a principal of the water jet pump as the fluid flows through the conduit Al from the collecting tank Aw.

Given the above-described treatment facility, a disturbing frothing in the supply reservoir can be prevented, even given treatment fluids having a high wetting agent content. The described measure for reducing, preventing or suppressing the frothing have proven themselves excellent in the treatment of printed circuit boards with a cleaner/conditioner solution having a wetting agent content of about 25%. Utilization is to be fundamentally recommended in all instances where the return of the treatment fluid into a supply reservoir or into a sump as well would lead to a disturbing frothing.

Although various minor modifications may be suggested by those versed in the art, it should be understood that I wish to embody within the scope of the patent granted hereon all such modifications as reasonably and properly come within the scope of my contribution to the art.

I claim:

1. In a treatment facility for treating workpieces while moving in a horizontal plane through the facility, said facility including a treatment cell for the treatment fluids, means for supplying fluid to the cell from a reservoir including a pump and feed conduit and means for discharging fluid from the cell to the reservoir and including a discharge conduit, the improvements comprising means for suppressing foaming of the fluid being returned to the reservoir, said means for suppressing including a distributor pipe being connected to the discharge conduit and having at least one exit slot, said distributor pipe being positioned in the reservoir with the exit slot being arranged above a fluid level of the fluid in said reservoir.

2. In a treatment facility according to claim 1, wherein the discharge conduit discharges into the distributor pipe from below via a U-shaped elbow.

3. In a treatment facility according to claim 2, wherein the distributor pipe comprises the shape of a closed ring.

4. In a treatment facility according to claim 3, wherein the distributor pipe has a continuous exit slot.

5. In a treatment facility according to claim 4, wherein the distributor pipe has a circular cross section.

6. In a treatment facility according to claim 4, wherein the distributor pipe has an oval cross section.

7. In a treatment facility according to claim 4, wherein the discharge conduit has a regulating valve.

8. In a treatment facility according to claim 7, wherein the feed conduit has a regulating valve positioned between the pump and the treatment cell.

9. In a treatment facility according to claim 1, wherein the distributor pipe has a shape of a closed ring.

10. In a treatment facility according to claim 9, wherein the exit slot of the distributor pipe is a continuous exit slot.

11. In a treatment facility according to claim 10, which includes a regulating valve being positioned in the discharge conduit.

12. In a treatment facility according to claim 11, which includes a regulating valve being positioned in the feed conduit between the pump and the treatment cell.

13. In a treatment facility according to claim 1, which includes a regulating valve being arranged in the discharge conduit.

14. In a treatment facility according to claim 13, which includes a regulating valve being arranged in the feed conduit between the pump and the treatment cell.

15. In a treatment facility according to claim 1, wherein the treatment cell has a weir, wherein said means for discharging fluid from the cell includes a holding chamber receiving fluid passing over the weir of the treatment cell and said discharge conduit extending from said holding chamber to the distributor pipe in the reservoir.

16. In a treatment facility according to claim 15, wherein the distributor pipe has a shape of a closed ring and the exit slot is a continuous slot.

17. In a treatment facility according to claim 16, wherein the discharge conduit has a U-shaped elbow immediately adjacent its connection to the distributor pipe.

18. In a treatment facility according to claim 17, wherein the discharge conduit includes a regulator valve.

19. In a treatment facility according to claim 16, wherein the discharge conduit has a regulator valve.

* * * * *